(12) United States Patent
Nakai et al.

(10) Patent No.: US 8,524,002 B2
(45) Date of Patent: *Sep. 3, 2013

(54) SILICON WAFER AND METHOD FOR PRODUCING THE SAME

(75) Inventors: Katsuhiko Nakai, Yamaguchi (JP); Masamichi Ohkubo, Yamaguchi (JP)

(73) Assignee: Siltronic AG, Munich (DE)

( * ) Notice: Subject to any disclaimer, the term of this patent is extended or adjusted under 35 U.S.C. 154(b) by 353 days.

This patent is subject to a terminal disclaimer.

(21) Appl. No.: 12/973,021

(22) Filed: Dec. 20, 2010

(65) Prior Publication Data

US 2011/0156216 A1  Jun. 30, 2011

(30) Foreign Application Priority Data

Dec. 29, 2009  (JP) .................................. 2009-299166

(51) Int. Cl.
*H01L 21/322* (2006.01)
*H01L 29/32* (2006.01)
*C30B 15/00* (2006.01)
*C30B 15/02* (2006.01)

(52) U.S. Cl.
USPC ................. 117/19; 117/13; 117/20; 438/473; 257/617; 257/E21.318

(58) Field of Classification Search
USPC ............... 117/13, 19, 20; 257/617, E21.318; 438/473
See application file for complete search history.

(56) References Cited

U.S. PATENT DOCUMENTS

| | | |
|---|---|---|
| 2002/0081440 A1 | 6/2002 | Murakami et al. |
| 2006/0225640 A1* | 10/2006 | Ono et al. ......................... 117/20 |
| 2009/0022930 A1 | 1/2009 | Falster et al. |
| 2010/0164071 A1* | 7/2010 | Nakai et al. .................... 257/617 |

FOREIGN PATENT DOCUMENTS

| | | |
|---|---|---|
| EP | 1 154 048 A1 | 11/2001 |
| EP | 1 887 110 A1 | 2/2008 |
| JP | 2000272996 A | 10/2000 |
| JP | 2005142434 A | 6/2005 |
| JP | 2007001847 A | 1/2007 |
| JP | 2007176732 A | 7/2007 |

OTHER PUBLICATIONS

Werner Zulehner et al., Crystal Growth, Properties and Applications, p. 28, Springer-Verlag, New York, 1982.
V. Voronkov, Journal of Crystal Growth, "The Mechanism of Swirl Defects Formation in Silicon", 59 (1982) 625 to 643.

* cited by examiner

*Primary Examiner* — Calvin Lee
*Assistant Examiner* — Scott Stowe
(74) *Attorney, Agent, or Firm* — Brooks Kushman P.C.

(57) ABSTRACT

Silicon wafers doped with nitrogen, hydrogen and carbon, have a plurality of voids, wherein 50% or more of the total number of voids are bubble-like shaped aggregates of voids;

a V1 region having a void density of over $2 \times 10^4/cm^3$ and below $1 \times 10^5/cm^3$ which occupies 20% or less of the total area of the silicon wafer;

a V2 region having a void density of $5 \times 10^2$ to $2 \times 10^4/cm^3$ which occupies 80% or more of the total area of said silicon wafer; and a bulk micro defect density which is $5 \times 10^8/cm^3$ or more, have excellent GOI characteristics and a high C-mode pass rate. The wafers are cut from a single crystal pulled by a method in which carbon, nitrogen, and hydrogen dopants are controlled, and the crystal is subjected to rapid cooling.

3 Claims, 8 Drawing Sheets

Fig. 3
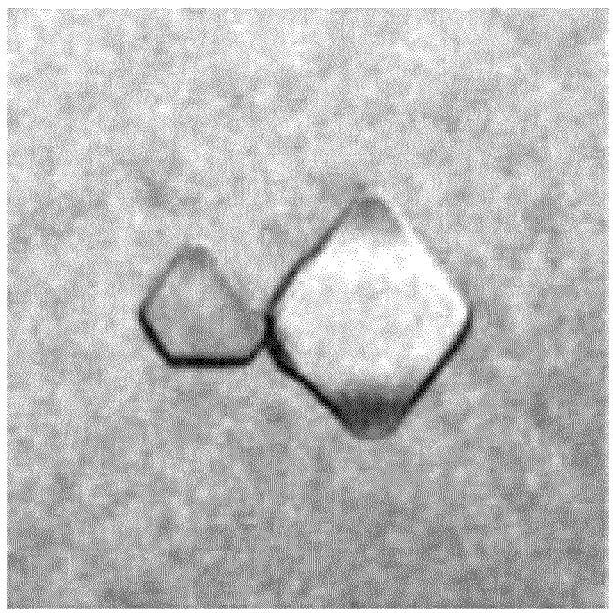
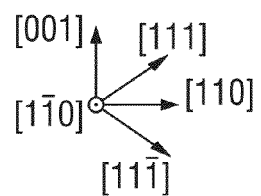
100nm
Fig. 4
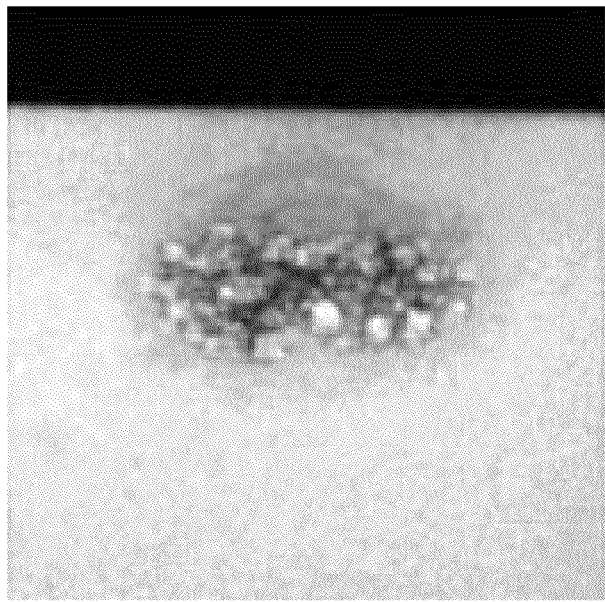
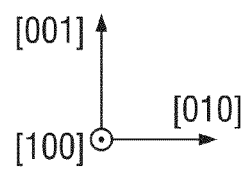
100nm Fig. 5
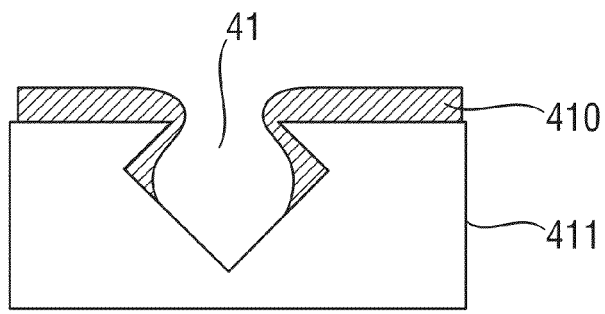
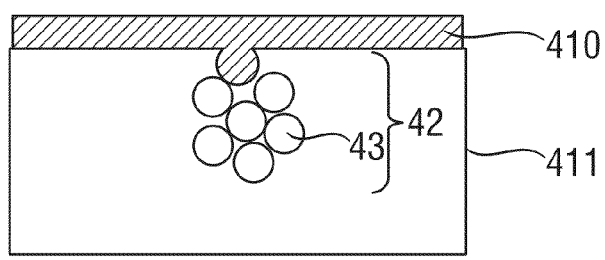
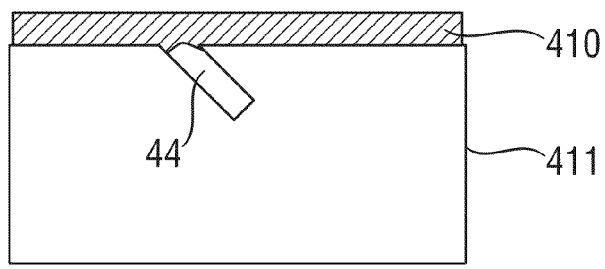

SILICON WAFER AND METHOD FOR PRODUCING THE SAME

CROSS-REFERENCE TO RELATED APPLICATION

This application claims priority to Japanese Patent Application No. JP2009-299166 filed Dec. 29, 2009 which is herein incorporated by reference.

BACKGROUND OF THE INVENTION

1. Field of the Invention

The present invention relates to a silicon wafer and a production method therefor. More specifically, the present invention relates to a polished (mirror processed) silicon single crystal wafer (mirror wafer) which is doped with nitrogen, hydrogen and carbon, and comprises a void region, and method for producing the silicon wafer.

2. Background Art

Characteristics of the growth of a silicon single crystal by the Czochralski ("CZ") method include (1) crystal growth from a free surface of a melt which is gravitationally stable, (2) doping or adjustment of impurities, which is necessary to adjust resistivity, taking into account a concentration gradient in an axial direction due to a segregation coefficient specific to the kind of impurity, (3) control of the oxygen concentration effective to getter metal impurities by dissolving oxygen from the crucible and control of the oxygen concentration or dopant concentration by control of the pulling conditions, (4) the use of a quartz crucible or graphite parts having higher purity and larger scale, and (5) use of a large sized apparatus which enables the growth of a large diameter silicon single crystal which is free of dislocations. As large size silicon single crystals grown by the Czochralski method are used as a substrate for LSI, severe control of the quality of the silicon crystal is required.

Grown-in defects existing inside a crystal just after silicon single crystal growth, oxygen precipitates, dislocations induced in device production process, and stacking faults, etc. deteriorate device characteristics. On the other hand, it is known that oxygen precipitates can be utilized effectively as a gettering site of heavy metals and increase the mechanical strength of the substrate, and thus they are considered as indispensible impurities at present, and control of these crystal defects is very important.

Accordingly, to control these crystal defects, various techniques have been tried to produce a wafer where density or size of grown-in defects is controlled, and for example, published Japanese patent application JP-A-2006-312576 discloses production of a silicon single crystal, in which a defect-free region, where grown-in defects do not exist, is enlarged over the whole wafer surface, while still having sufficient BMDs which provide gettering action in the inside, by setting the nitrogen concentration in the single crystal at from $1\times10^{12}$ to less than $5\times10^{14}$ atoms/cm$^3$ and by setting hydrogen partial pressure in the gas inside the growth apparatus at less than or equal to 40 to 400 Pa, in the course of producing the silicon crystal.

According to a production method of the above published application it is disclosed that as a result of indispensably requiring production under hydrogen partial pressure, and by doping of carbon or the like so as to suppress formation of the ring-like OSF appearing in the crystal, the allowable upper limit of oxygen concentration can be increased, without elicitation of OSF nuclei. Therefore, a wafer can be produced which is composed of a defect-free region, without decreasing device characteristics, even when the oxygen concentration is high. In addition, as is also described in the published application, the relevant defect-free region includes an oxidation induced stacking fault (hereafter may be referred to simply as "OSF") region, a $P_V$ region (a defect-free region where vacancy point defects are dominant) and a $P_i$ region (a defect-free region where interstitial silicon point defects are dominant).

Published Japanese patent application JP-A-2005-142434 discloses a production method for a silicon single crystal wafer obtained by slicing a silicon single crystal doped with carbon and nitrogen, and then heat treating the wafer at a temperature of 900° C. up to the melting point of the silicon single crystal, under a mixed gas atmosphere.

In JP-A-2006-312576, as shown in paragraphs [0048] to [0052] and FIG. 4, it has been confirmed that by pulling-up the silicon crystal using a growing apparatus having a hot zone causing the temperature gradient of the single crystal just after solidification in the pulling direction to be smaller at the crystal peripheral part (Ge) than at the crystal center part (Gc), and growing under a predetermined hydrogen partial pressure, the $P_i$ region widens. However, the $P_i$ region is not adequate for applications where IG is required, because of the inability to form BMDs. Moreover, doping with nitrogen or carbon in a predetermined concentration does not lead to a significant improvement, since the $P_v$ region hardly changes by the doping of carbon, and the $P_v$ region does not change by the doping of nitrogen, even when the hydrogen partial pressure is over 160 Pa. Therefore, in the production method described in JP-A-2006-312576 there is a problem that widening of the $P_v$ region cannot be controlled effectively.

In addition, in the above JP-A-2005-14234, a silicon single crystal wafer with high crystallinity and high thermal conductivity is produced by decreasing the size of grown-in defects as much as possible by doping with nitrogen and carbon, and then by performing heat treatment of the silicon wafer so as to decrease defects in particular at the surface layer portion of the wafer. However, the problem remains that sufficient IG cannot be obtained due to a low density of oxygen precipitates.

In addition, the occurrence of voids (holes formed by aggregated vacancy point defects) is less in particular in the OSF region. Such an OSF region is characterized by the absence of crystal defects which deteriorate gate oxide integrity (GOI) of an oxide film, namely C-mode characteristics (high C-mode pass rate). In such a nitrogen-doped crystal, a region having relatively low void density (specifically, a region having a void density of over $1\times10^3$/cm$^3$ and less than or equal to $5\times10^3$/cm$^3$ in the nitrogen-doped crystal) is present which has inferior high C-mode pass rate. Therefore, the nitrogen doped crystal disclosed in the above JP-A-2005-142434 cannot be said to have a high C-mode pass rate as a whole, and is inferior in GOI of the oxide film.

SUMMARY OF THE INVENTION

Accordingly, it is an object of the present invention to provide a silicon wafer composed of a silicon crystal formed with gettering BMDs inside, and having a decreased amount of grown-in defects, which is superior in GOI of an oxide film, and which has good C-mode characteristics (good high C-mode pass rate). In addition, it is another object of the present invention to provide a production method for the above silicon wafer.

In view of the above problems, as a result of intensive studies carried out by the present inventors, it has been found that a silicon crystal (single crystal silicon) having excellent GOI characteristics of an oxide film, and good C-mode characteristics (good in high C-mode pass rate) can be obtained by the doping of nitrogen, carbon and hydrogen in predetermined concentrations. In addition, the present inventors have found that when carbon is not added at a level of at least the predetermined concentration, the OSF does not disappear, even by increasing the hydrogen concentration in the silicon melt to any level.

In addition to the doping of nitrogen, carbon and hydrogen in predetermined concentrations, "rapid cooling" treatment is carried out and the silicon crystal is pulled at a predetermined temperature gradient (hereafter referred to as "average temperature gradient in a crystal growth longitudinal direction" or simply "G"), and at a predetermined pulling speed (hereafter referred to simply as "V"). It has been found that, by this treatment, a silicon crystal having still more excellent GOI characteristics of an oxide film, and still better C-mode characteristics can be obtained.

BRIEF DESCRIPTION OF THE DRAWINGS

FIG. 3 is a transmission electron microscope photo, showing an octahedron-like void aggregate, present in a usual silicon wafer.

FIG. 4 is a transmission electron microscope photo, showing a bubble-like shaped aggregate of voids present in a silicon wafer of the present invention.

FIG. 5 is a drawing schematically showing the influence of an octahedron-like void and a bubble-like shaped aggregate of voids on oxide film formation.

DETAILED DESCRIPTION OF THE PREFERRED EMBODIMENTS

Figure 1:
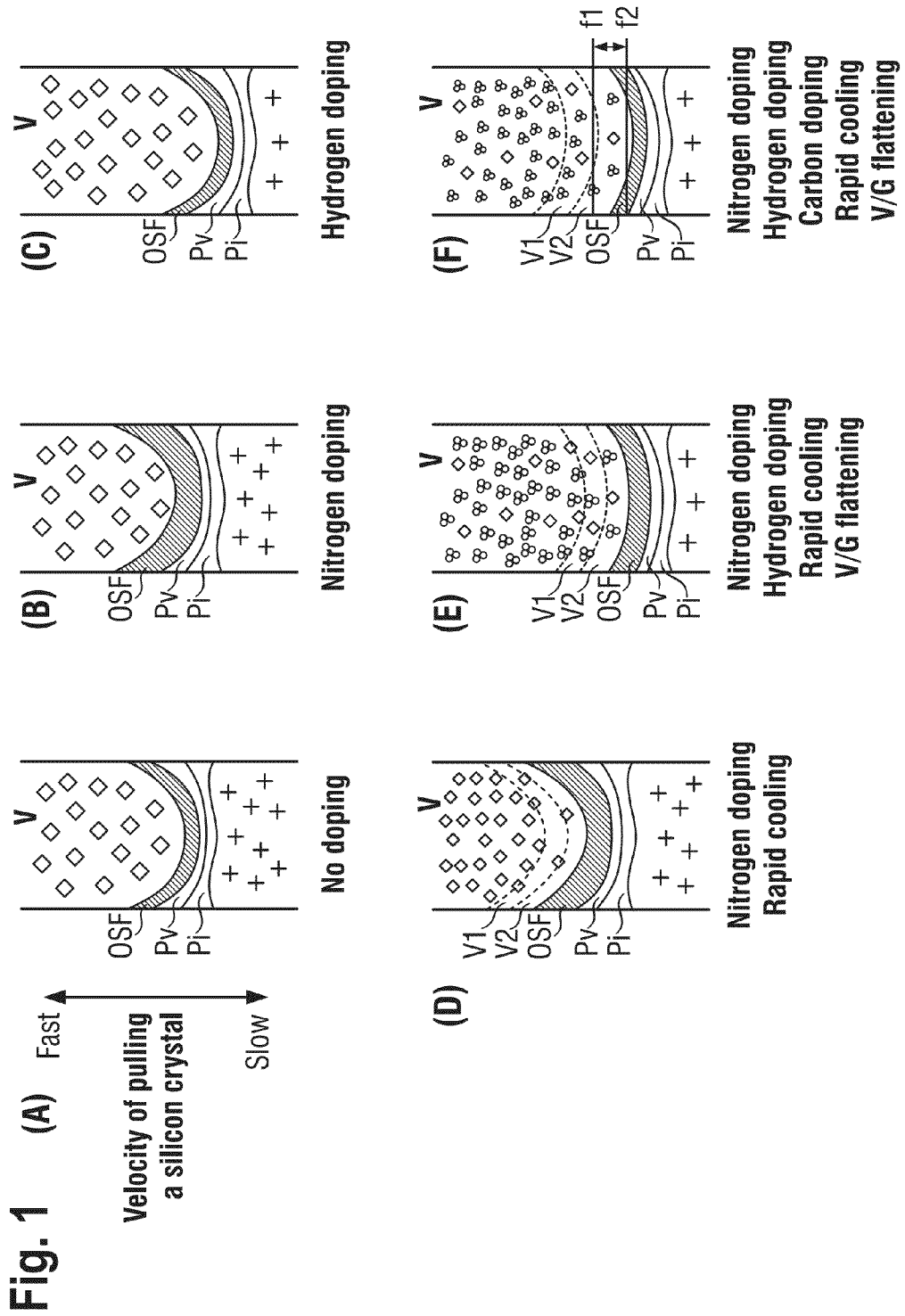
FIG. 1 is a cross-sectional view of a silicon crystal, schematically showing the influence of doping with nitrogen, carbon and hydrogen and rapid cooling on the generation of crystal defects.

Here, explanation will be given on characteristics of "rapid cooling" according to the present invention. Conventionally, rapid cooling of the silicon crystal has been carried out in view of enhancing productivity. However, in conventional rapid cooling, it has been usual to increase both temperature gradient and pulling speed. On the other hand, the present inventors have found that "rapid cooling" by limiting the temperature gradient within a very narrow predetermined range, and maintaining the pulling speed at a level similar to that of a conventional method, makes the void density significantly small, and the voids compose bubble-like shaped aggregates of voids which do not influence the function of a semiconductor device.

That is, the present invention for attaining the above objects relates to a silicon single crystal wafer which is doped with nitrogen, carbon and hydrogen, comprising: a plurality of voids, wherein greater than or equal to 50% of the total number of voids compose bubble-like shaped aggregates of voids; a V1 region having a void density of over $2 \times 10^4/cm^3$ and below $1 \times 10^5/cm^3$ which occupies less than or equal to 20% of the total area of the silicon wafer; a V2 region having a void density of $5 \times 10^2$ to $2 \times 10^4/cm^3$ which occupies greater than or equal to 80% of the total area of the silicon wafer; and a bulk micro defect density which is greater than or equal to $5 \times 10^8/cm^3$.

In addition, the present invention relates to a method for producing the silicon wafer, the method comprising pulling a silicon single crystal in a pulling furnace with a crystal pulling speed and doping the silicon crystal with nitrogen, carbon and hydrogen; controlling the nitrogen concentration in the silicon crystal to $3 \times 10^{13}$ to $3 \times 10^{15}$ atoms/cm$^3$; controlling a carbon concentration in the silicon crystal to be $1 \times 10^{15}$ to $9 \times 10^{15}$ atoms/cm$^3$; controlling the partial pressure of hydrogen in the crystal pulling furnace to 3 to 60 Pa; controlling the temperature gradient in a longitudinal direction of the silicon crystal within a temperature range of 1100° C. to 1200° C. to greater than or equal to 3.5° C./mm; controlling the crystal pulling speed to be less than or equal to an upper limit value and greater than or equal to a lower limit value; and cutting a silicon wafer from the silicon single crystal, wherein the silicon wafer comprises a V1 region having a void density of over $2 \times 10^4/cm^3$ and below $1 \times 10^5/cm^3$ which occupies 20% of total area of the silicon wafer if the single crystal was pulled with the upper limit value of the crystal pulling speed, and comprises a V2 region having a void density of $5 \times 10^2$ to $2 \times 10^4/cm^3$ which occupies 80% of total area of said silicon wafer if the single crystal was pulled with the lower limit value of the crystal pulling speed.

According to the present invention, a silicon wafer (a mirror wafer) with high quality suitable for use in processing to form semiconductor devices, can be obtained. The silicon wafer has sufficient BMDs (bulk micro defects) inside which act as gettering-sites, is superior in GOI of the oxide film, and has good high C-mode pass rate. In addition, because the pulling speed of the silicon crystal from which the silicon wafer is cut can be increased still more, productivity can be enhanced significantly.

Explanation will be given below on the best embodiments applying the present invention, accompanied by reference to the drawings. It should be noted that the drawings are schematic, to assist understanding of the present invention, therefore proportions of dimension, shape, and configuration are drawn with exaggeration. Therefore, the drawings are partially different from what is observed in practice.

DETAILED DESCRIPTION OF THE PREFERRED EMBODIMENTS

The silicon wafer of the present invention is characterized in being doped with nitrogen, carbon and hydrogen, in having bulk micro defects in a degree required for gettering in a device process (hereafter referred to as "BMD value"), and in having voids which form specifically shaped aggregates. Explanation will be given below in detail on each of the characteristics.

FIG. 1 is a cross-sectional view of a silicon crystal, schematically showing the influence of doping the silicon crystal with nitrogen, carbon and hydrogen, and subjecting the silicon crystal to the "rapid cooling" treatment according to the present invention on the generation of crystal defects. The pulling speed of a silicon crystal shown in FIG. 1 is higher at the more upward position, when viewed in a longitudinal direction. In addition, in FIG. 1, [A] represents the case without doping of the single crystal with nitrogen, carbon and hydrogen, [B] the case with doping of the silicon crystal with nitrogen, only, [C] the case with doping of the silicon crystal with hydrogen, only, [D] the case with doping of the silicon crystal with nitrogen and with subjecting the silicon crystal to the "rapid cooling" treatment, [E] the case with doping the silicon crystal with nitrogen and hydrogen, and with subjecting the silicon crystal to the "rapid cooling" treatment, and [F] the case with doping the silicon crystal with nitrogen, carbon and hydrogen, and with subjecting the silicon crystal to the "rapid cooling" treatment. Any of [A] to [F] of FIG. 1 has a V region having voids (a region with many holes which are formed by aggregated vacancy point defects), an OSF region (an oxidation induced stacking fault region), a Pv region, a Pi region, and an I region (a region with many defects formed by clusters of interstitial silicon point defects). [A] to [D] and [E] to [F] of FIG. 1 differ in void shape, and also [D], [E] and [F] in FIG. 1 have characteristics of having a special V1 region and V2 region at a part of the V region. Presence or absence of each treatment in [A] to [F] is summarized in the following Table 1.

"V1 region" in this description refers to a region having a void density in a range of over $2\times10^4/cm^3$ and below $1\times10^5/cm^3$, and "V2 region" refers to a region having a void density in a range of $5\times10^2$ to $2\times10^4/cm^3$.

TABLE 1

| | [A] | [B] | [C] | [D] | [E] | [F] |
|---|---|---|---|---|---|---|
| Nitrogen doping | No | Yes | No | Yes | Yes | Yes |
| Hydrogen doping | No | No | Yes | No | Yes | Yes |
| Carbon doping | No | No | No | No | No | Yes |
| Rapid cooling treatment | No | No | No | Yes | Yes | Yes |
| Remark | | | | | flat V/G | flat V/G |

First, it has been found that the shape of voids present in the V region of a conventional silicon crystal is, as shown in FIG. 3, an octahedron having a {111} plane (in FIG. 1, it is represented by a square symbol). In a silicon crystal with a crystal size of equal to or larger than 200 mm produced by the Czochralski method, the size of the octahedral void is about 100 to 300 nm. Such an octahedron-like void may highly influence a decrease in device performance, in particular, GOI characteristics of the oxide film.

On the other hand, in the silicon wafer according to the present invention, bubble-like shaped aggregates of voids are present, each aggregate composed of a plurality of smaller voids, wherein the number of voids composing bubble-like aggregates of voids is ≧50% of the total void number (refer to (E) and (F) of FIG. 1). Here, the "total void number" represents the number of voids contained in the bubble-like shaped aggregates of voids and the number of voids not contained therein.

The present inventors performed intensive studies and observed silicon single crystal wafers with a transmission electron microscope (TEM, JEM-2010, manufactured by JEOL, Ltd.). Observation direction was in the 110 direction, and the diffraction condition was set to a two-wave condition, where the 220 reflection is excited. By setting mismatching amount S from the Bragg condition to be larger than 1 g, the above-mentioned bubble-like shaped aggregates of voids were discovered, and it has been found that such a bubble-like shaped aggregates of voids significantly enhance the high C-mode pass rate, as compared with conventional octahedron-like shaped voids.

FIG. 4 is a transmission electron microscope photo showing a bubble-like shaped aggregate of voids which is present in a silicon single crystal wafer according to the present invention. The shape of the aggregate as shown in FIG. 4 looks like a bubble. The aggregate is formed when a plurality of voids not having the {111} plane, and not being a regular octahedron, like the void shown in FIG. 3, are assembled.

Therefore, the peculiar aggregates of voids which are observed in the silicon single crystal wafer according to the present invention are called "bubble-like shaped aggregates of voids". In the case of the silicon wafer having such a void configuration, as will be described later, an effect is, exerted such that the voids have little adverse influence on a device fabricated on the wafer. Still more, a bubble-like shaped aggregate of voids of the present invention can be said to be a considerably "harmless" void.

A possible mechanism for how the bubble-like shaped aggregate of voids affect the breakdown voltage characteristics of the oxide film is speculated as follows. FIG. 5 represent schematic cross-sectional views showing states where oxide film 410 are formed on voids exposed at the silicon wafer 411 surfaces. First, (A) shows the case of the octahedron void 41, and (B) shows the case of the bubble-like shaped aggregate 42 of voids. In the case of the octahedron void 41, the void 41 is never completely covered by the oxide film, providing a state of incomplete formation of the oxide film. In such an oxide film, GOI is easily deteriorated. On the other hand, in the case where the bubble-like shaped aggregate 42 of voids is exposed at the surface, it is completely covered by the oxide film, because the size of each void 43 constituting the bubble-like shaped aggregate 42 is small. As a result, deterioration of the GOI of the oxide film is difficult. On the other hand, a void 44 of a silicon crystal doped with nitrogen only is known to have a plate-like or a bar-like shape 44 (refer to JP-A-2001-151596). In the case of such a void, a void is never completely covered by the oxide film as shown in (C), and thus the voltage which devices can withstand is easily decreased, similarly as shown in (A).

In the case where voids form the bubble-like shaped aggregate of voids, the size of each void constituting the bubble-like shaped aggregate of voids being small, and its form being almost a sphere, a decrease in the breakdown voltage characteristics of the oxide film is made difficult. It should be noted that "form of almost a sphere" in the present description means a shape having a ratio A/B (aspect ratio) which is less than or equal to 2, wherein. A is the maximal diameter and B is the diameter in a perpendicular direction to the direction where A is obtained, in measurement of the size by observing the void from a certain observation surface. In the case where the aspect ratio is over 2, as shown in FIG. 5(C), the void is never completely covered by the oxide film, therefore the breakdown voltage characteristic is easily decreased.

The size of a void constituting the bubble-like shaped aggregate of voids of the present invention is preferably less than or equal to 50 nm, and more preferably less than or equal to 30 nm. The number of voids constituting the aggregate is not especially limited, however, it is preferably greater than or equal to 5, more preferably greater than or equal to 10, and still more preferably 20 to 100. The void size within the above ranges further enhances the effect that the aggregates are found to be "harmless". In particular, in the case where the number of voids constituting the aggregate is greater than or equal to 5, identification of the aggregate with TEM (to be described later) may become easy. That is, in all of the cases where a microscope is used in observation on the voids in the present description, the above TEM may be used, although there is a limitation on resolution.

In addition, the number of voids constituting bubble-like shaped aggregates of voids is greater than or equal to 50% of the total number of voids present in the silicon single crystal wafer (voids with any kind of the shape, including octahedron-like shape); the number of such voids is preferably greater or equal to 70%, and still more preferably greater than or equal to 90%. The presence within the above preferred ranges still more enhances the effect that the aggregates are found to be "harmless".

Next, description will be given on the relationship between the ratio of voids constituting bubble-like shaped aggregates of voids to the total number of voids and the voltage (resistance) characteristics of the oxide film. As described above, bubble-like shaped aggregates of voids make a reduction in breakdown voltage of the oxide film. Therefore, by increasing the ratio of the voids constituting bubble-like shaped aggregates of voids (voids which are "harmless" for breakdown voltage characteristics of the oxide film) to the total number of voids, the breakdown voltage of the oxide film can be improved. By setting the ratio of voids constituting bubble-like shaped aggregates of voids to the total number of voids at greater than or equal to 50%, the high C-mode pass rate of the V1 region having a void density of over $2\times10^4/cm^3$ and below $1\times10^5/cm^3$, becomes 20 to 40%, and the high C-mode pass rate of the V2 region having a void density from $5\times10^2$ to $2\times10^4/cm^3$ becomes 70 to 100%. In the case where the bubble-like shaped aggregate of voids is absent, the V1 region and V2 region both provide a high C-mode pass rate of 20 to 40%.

In the present invention, a defect region comprising voids was evaluated by the following method. In-plane distribution of voids in the silicon wafer was measured by using an LSTD scanner (MO-6), manufactured by Raytex Co., which is a commercial defect evaluation apparatus. This MO-6 irradiates using a visible light laser from a Brewster's angle, and detects a scattered image of p-polarized light as a defect image, with a camera arranged in a vertical direction. Because the laser penetrates only down to 5 μm from the substrate surface, a defect present at a depth of down to 5 μm from the substrate surface can be measured. By adjustment of detection sensitivity, voids with a size of greater than or equal to 50 nm, as converted to a sphere, were measured. The volume density of the voids was calculated from the area density of the voids measured, and the penetration depth of 5 μm. In addition, a region having a void density of over $2\times10^4/cm^3$ and below $1\times10^5/cm^3$, was defined as the V1 region, and a region having a void density of $5\times10^2$ to $2\times10^4/cm^3$, was defined as the V2 region.

In addition, a bubble-like shaped aggregate of voids was identified by the following method. About ten voids among those observed by using MO-6 were subjected to shape investigation by using a transmission electron microscope (TEM). An aggregate composed of a plurality of voids (it was confirmed that 40 voids or more were present in the aggregate of voids shown in the photo of FIG. 4) was defined as a bubble-like shaped aggregate of voids. Ratio of the aggregate was determined from an observation result with TEM.

A silicon wafer according to the present invention has, in addition to the above void configuration, two regions (V1 region and V2 region), having a void density in a predetermined range, which is significantly smaller than that in the V region. The regions (V1 and V2 regions) comprising voids of predetermined size and predetermined density function as substantially defect-free regions and regions which secure sufficient gettering-sites.

Figure 2:
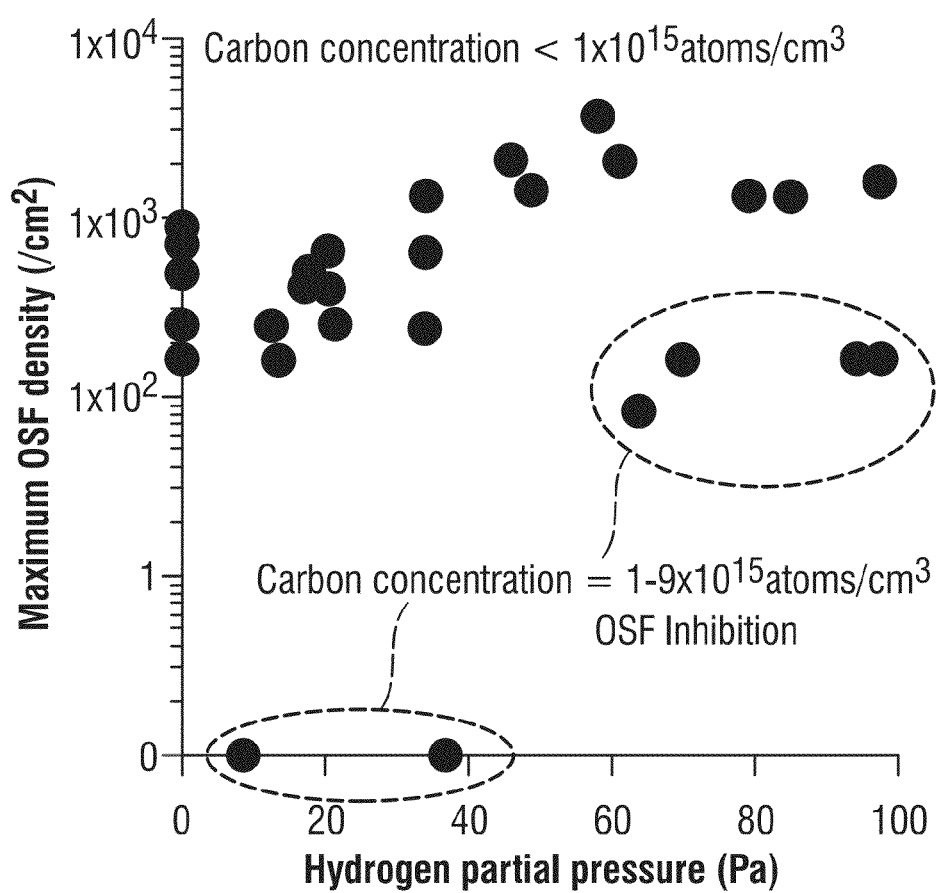
FIG. 2 is a drawing showing the relationship between partial pressure of hydrogen and OSF density.

Explanation will be given in detail also later on these V1 and V2 regions. However, it has been confirmed by the present inventors that, in order to form the V1 and V2 regions, predetermined nitrogen doping concentration, predetermined hydrogen partial pressure, and predetermined cooling rate are mandatory. However, as shown in FIG. 2, unless a certain degree of carbon concentration is present inside the silicon crystal, OSF defects do not disappear even by changing amount of hydrogen partial pressure (referring to [F] of FIG. 1, the OSF region does not move downward), and the V1 and V2 regions substantially functioning as a defect-free regions, are not formed.

The present inventors have performed OSF evaluation by the following method on wafers obtained under various hydrogen partial pressure and carbon concentration. Firstly, the substrate was treated at 1100° C. for 1 hour under an atmosphere of steam-containing oxygen. After that, the oxide film was removed with hydrofluoric acid, and then the substrate was etched by 1.5 μm with light etchant, and ellipse-shaped, half-moon-shaped or rod-shaped OSF pits generated at the surface were observed with an optical microscope. An OSF area density [pieces/$cm^2$] was determined [OSF pit number/observation area] by counting the OSF pit number in a field of view of a diameter of 2.5 mm with an optical microscope. By investigating the OSF area density along a diameter direction of the wafer, the largest OSF area density among them was determined. As a result, as shown in FIG. 2, in the wafer doped with $1\times10^{15}$ to $9\times10^{15}$ atoms/$cm^3$ of carbon, the OSF disappeared when hydrogen partial pressure became equal to or lower than 60 Pa. On the other hand, in the wafer not intentionally doped with carbon and having a carbon concentration of below $1\times10^{15}$ atoms/$cm^3$, the OSF never disappeared even when hydrogen partial pressure was changed.

It should be noted that in the case of the bubble-like shaped aggregates of voids, each void composing the aggregate is measured as one void.

As is shown in [F] of FIG. 1, the V1 region and the V2 region are present between the V region and the OSF region. The V1 region and the V2 region (in particular, the V2 region), having significantly lower void density, as compared with the V region where the density is over $1\times10^5/cm^3$, are considered a factor for providing a silicon single crystal wafer having significantly excellent breakdown voltage characteristics of an oxide film, and significantly high C-mode characteristics, as well as the factor that the majority of voids which are present in the wafer compose bubble-like shaped aggregates of voids.

In the case where a silicon wafer does not substantially contain hydrogen ([A], [B] and [D] of FIG. 1), in addition to the above mentioned void configuration, it becomes difficult to obtain high C-mode characteristics in a degree suitably applicable to the semiconductor device, even when the void density can be made equal to or lower than $2\times10^4/cm^3$. Still more, even in the case where hydrogen is contained ([C] and [E] of FIG. 1), the void density is high and many voids remain in the silicon wafer which cause a decrease in yield of a finely integrated circuits.

On the other hand, in the silicon wafer according to the present invention, by doping of hydrogen, carbon in addition to nitrogen, and by carrying out the above mentioned "rapid cooling" treatment, the voids mainly compose aggregates of a bubble-like shape, rather than holes with a octahedron-like shape, and still more the void density can be made significantly lower as conventionally. In the case where the void density is equal to or lower than $2\times10^4/cm^3$ (less than or equal to the upper limit value of the V2 region), in addition to the above mentioned void configuration, adverse influences on the oxide film are low. As a result, the silicon single crystal wafer of the present invention provides excellent breakdown voltage characteristics of an oxide film, and significantly high C-mode characteristics. That is, in the case of adding carbon ([F] of FIG. 1), the boundary at the lower side of the V1 region sifts in an upward direction, and the boundary at the upper side of the V2 region sifts in a downward direction, as compared with the case of not adding carbon ([E] of FIG. 1). As a result, the width of the V2 region is broadened, and high C-mode pass rate of equal to or higher than 70% can be attained more easily over the whole wafer, as compared with the case of not adding carbon. On the other hand, even in the case where carbon is added, if the amount of hydrogen doping is too high, the OSF region widens and the V2 region disappears, and it is difficult to attain a high C-mode pass rate of equal to or higher than 70%.

In addition, if the void density is equal to or higher than $5 \times 10^2/cm^3$ (equal to or higher than the lower limit value of the V2 region), and if the voids have the above mentioned configuration, most parts of the region do not overlap with the OSF region which is present in a region having the void density below $5 \times 10^2/cm^3$. Therefore, a high C-mode pass rate, in a degree suitably applicable to the semiconductor device relevant to the present invention, can be obtained. It should be noted that a region between f1-f2 in (F) of FIG. 1 represents a silicon wafer according to the present invention. It is understood that, when (F) of FIG. 1 is observed, only a small part of both ends, in the silicon wafer, includes the OSF region.

The V region, having a void density of over $1 \times 10^5/cm^3$, has the high C-mode pass rate of 0%, but presence of such a region in a wafer, even in small amount, may make it difficult to produce a wafer having the high C-mode pass rate of equal to or higher than 70%, over the whole wafer. On the other hand, because the V2 region having a void density of $2 \times 10^4$ to $5 \times 10^2/cm^3$ has the high C-mode pass rate of 70 to 100%, it becomes possible to produce a wafer having a high C-mode pass rate of equal to or higher than 70%, over the whole wafer, by setting all of the wafer surface to be the V2 region. The V1 region positioned between the V region and the V2 region has a high C-mode pass rate of 20 to 40%, but, as long as this region is present in a ratio of equal to or lower than 20% relative to total area of the wafer, it becomes possible for attaining the high C-mode pass rate of equal to or higher than 70%, over the whole wafer.

In view of productivity, it is preferable that the void density is as small as possible in view of suppression of generation of grown-in defects, but becomes equal to or higher than $5 \times 10^2/cm^3$, and that the lower limit value of V/G is specified at 0.7.

The V2 region specified in this way occupies greater than or equal to 80% of the total area of the silicon wafer according to the present invention. In such a case, voltage breakdown characteristics of the oxide film becomes extremely good, as well as the high C-mode pass rate which can be equal to or higher than 70%. In the case where the high C-mode pass rate is equal to or higher than 70%, such a silicon wafer can be used sufficiently in a device such as DRAM or the like requiring less severe breakdown voltage characteristics of the oxide film, as compared with a flash memory. In addition, the V2 region preferably occupies 90% or more, and more preferably occupies 95 to 100%, of the total area of the silicon wafer.

On the other hand, the V1 region (a region having a void density of over $2 \times 10^4/cm^3$ and below $1 \times 10^5/cm^3$) occupies less than or equal to 20% of the total area of the silicon wafer. In such a case, the breakdown voltage characteristic of the oxide film is further improved, as well as the high C-mode pass rate, which surely becomes 70% or more.

The bulk micro defect density (BMD density) of the silicon wafer according to the present invention is greater than or equal to $5 \times 10^8/cm^3$, preferably greater than or equal to $5 \times 10^9/cm^3$ and more preferably equal to or higher than $1 \times 10^9/cm^3$. It should be noted that this BMD density is the BMD density after heat treatment, and a BMD density within such a range can provide sufficient gettering capability.

The BMD density is measured as follows. First, heat treatment for oxygen precipitation (hereafter referred to also as "precipitation heat treatment") is carried out on the silicon wafer at 780° C. for 3 hours, subsequently at 1000° C. for 16 hours. Then, the silicon wafer is cleaved and subjected to a measurement of the in-plane BMD of the silicon wafer, for example with a BMD analyzer MO-4, manufactured by Raytex Co. In-plane positions of measurement points were set from the center to the edge, in a 10 mm pitch. In this way, the value of the BMD density is determined.

The nitrogen concentration of a silicon wafer according to the present invention is $3 \times 10^{13}$ to $3 \times 10^{15}$ atoms/cm$^3$, and the preferable nitrogen concentration is $2 \times 10^{14}$ atoms/cm$^3$ to $2 \times 10^{15}$ atoms/cm$^3$.

In the case where the relevant nitrogen concentration is greater than or equal to $3 \times 10^{13}$ atoms/cm$^3$, the BMD density can be greater than or equal to $5 \times 10^8$ atoms/cm$^3$, and when the lower limit of the nitrogen concentration is greater than or equal to $2 \times 10^{14}$ atoms/cm$^3$, the BMD density can be greater than or equal to $1 \times 10^9$ atoms/cm$^3$. In addition, when the relevant nitrogen concentration is less than or equal to $3 \times 10^{15}$ atoms/cm$^3$, because there is little overlap of the OSF region and the V2 region, it is possible to attain a high C-mode pass rate of greater than or equal to 80% in most regions in the resultant silicon wafer. It should be noted that the nitrogen concentration in the silicon single crystal and the nitrogen concentration in the resultant silicon single crystal wafer are substantially the same.

The carbon concentration in the silicon wafer according to the present invention is $1 \times 10^{15}$ to $9 \times 10^{15}$ atoms/cm$^3$, and the preferable carbon concentration is $3 \times 10^{15}$ atoms/cm$^3$ to $5 \times 10^{15}$ atoms/cm$^3$.

When the relevant carbon concentration is within a range of $3 \times 10^{15}$ to $5 \times 10^{15}$ atoms/cm$^3$, it becomes relatively easy to convert the whole wafer surface to the V2 region, and in addition, by setting the hydrogen partial pressure at 35 to 54 Pa, it becomes possible to attain a high C-mode pass rate of greater than or equal to 90%. It should be noted that the carbon concentration in the silicon single crystal and the carbon concentration in the resultant silicon single crystal wafer are substantially the same.

In addition, the silicon single crystal wafer according to the present invention contains nitrogen, hydrogen and carbon; contains a plurality of voids composing bubble-like shaped aggregates of voids which are present in 50% or more of the total number of voids; contains a V1 region having a void density of over $2 \times 10^4/cm^3$ and below $1 \times 10^5/cm^3$ which occupies equal to or less than 20% of the total area of the silicon single crystal wafer; contains a V2 region having a void density of $5 \times 10^2$ to $2 \times 10^4/cm^3$ which occupies at least 80% of the total area of the silicon single crystal wafer; and contains a bulk micro defect density which is greater than or equal to $5 \times 10^8/cm^3$. The silicon single crystal wafer according to the present invention is cut from a silicon single crystal produced by the present invention.

A second aspect of the present invention is a method for producing a silicon single crystal wafer comprising pulling a silicon single crystal and cutting the silicon single crystal wafer from the silicon single crystal. The single crystal is pulled in a pulling furnace by controlling the nitrogen concentration in the silicon single crystal to be $3\times10^{13}$ to $3\times10^{15}$ atoms/cm$^3$; by controlling the carbon concentration in the silicon single crystal to be $1\times10^{15}$ to $9\times10^{15}$ atoms/cm$^3$; by controlling the partial pressure of hydrogen in the crystal pulling furnace to 3 to 60 Pa; by controlling the temperature gradient in a longitudinal direction of the silicon single crystal within a temperature range from 1100 to 1200° C. during pulling of the silicon crystal to be 3.5° C./mm or higher; and by controlling the crystal pulling speed to be less than or equal to an upper limit value and greater than or equal to a lower limit value, wherein a wafer cut from the produced silicon single crystal comprises a V1 region having a void density of over $2\times10^4$/cm$^3$ and below $1\times10^5$/cm$^3$ which occupies 20% of the total area of the silicon wafer, if the single crystal was pulled with the upper limit value of the crystal pulling speed, and, wherein a wafer cut from the silicon single crystal comprises a V2 region having a void density of $5\times10^2$ to $2\times10^4$/cm$^3$ which occupies 80% of the total area of said silicon wafer, if the single crystal was pulled with the lower limit value of the crystal pulling speed.

In addition, the silicon single crystal wafer is cut from a silicon single crystal which was pulled in the manner described above.

Control of the pulling speed is carried out by control of size (width) of the V1 region (the region having the void density of over $2\times10^4$/cm$^3$ and below $1\times10^5$/cm$^3$), the V2 region (the region having the void density of $5\times10^2$ to $2\times10^4$/cm$^3$) and the OSF region. It should be noted that the pulling furnace is not especially limited, as long as the growth conditions of a crystal of the present invention can be attained. In addition, description will be given later on control of the pulling speed.

The method for producing the silicon wafer according to the present invention comprises doping the silicon single crystal with nitrogen, carbon and hydrogen in predetermined concentrations; controlling the partial pressure of hydrogen inside the crystal pulling furnace to a predetermined value; establishing rapid cooling of the silicon single crystal with a predetermined temperature gradient and a predetermined pulling speed; and adjusting the void density to within a predetermined range in at least a part of the body of the silicon single crystal. In addition, if necessary, the diameter of the silicon single crystal may be set at a predetermined value.

By the present invention, in particular, since nitrogen, carbon, and hydrogen are added in predetermined concentrations, and since "rapid cooling" is performed by controlling the temperature gradient within the specified temperature range at a predetermined value, the OSF region can be shrunk. As a result, any kind of micro fault which can be present in the OSF region, can be eliminated. In this way, a silicon wafer can be produced which is superior in GOI of an oxide film and has high C-mode pass rate, while maintaining a predetermined amount of BMD concentration as gettering-sites. In other words, with shrinking of the OSF region, a low void density region, which never crosses with the OSF region, can appear over a wide range. In addition, most parts of the silicon wafer obtained by the inventive production method are low void density regions having a trace amount of the shrunk OSF region (at the end part of the silicon wafer of (F) of FIG. 1).

Thus, although the void density becomes significantly low, considerable voids are still present which might lead to decrease in GOI of the oxide film or high C-mode pass rate. However, due to the method of the present invention (in particular, due to the doping of nitrogen, carbon and hydrogen in predetermined concentrations, and due to the "rapid cooling" treatment comprising a predetermined temperature gradient and a predetermined pulling speed), the majority of voids compose bubble-like shaped aggregates, and do not have a octahedron-like shape, which makes them harmless to considerable extent. The term "harmless" means that the voids provide substantially no adverse influences on a fabricated device. Still more, in such a case, because the pulling speed (V) is significantly increased, productivity may also be increased significantly.

The nitrogen concentration in a silicon single crystal wafer according to the present invention is $3\times10^{13}$ to $3\times10^{15}$ atoms/cm$^3$, and the preferable nitrogen concentration is $2\times10^{14}$ atoms/cm$^3$ to $2\times10^{15}$ atoms/cm$^3$. In the case where the nitrogen concentration is greater than or equal to $3\times10^{13}$ atoms/cm$^3$, the BMD density can be greater than or equal to $5\times10^8$ atoms/cm$^3$, and when the lower limit of the nitrogen concentration is greater than or equal to $2\times10^{14}$ atoms/cm$^3$, the BMD density can be greater than or equal to $1\times10^9$ atoms/cm$^3$. In addition, when the relevant nitrogen concentration is not more than $3\times10^{15}$ atoms/cm$^3$, because there is little overlap of the OSF region and the V2 region, it is possible to attain high C-mode acceptance rate (C-mode good product rate) of at least 80% in most regions of the resultant silicon wafer. The doping of nitrogen into the silicon single crystal can be performed by any known method, for example, by charging a silicon wafer having a nitride film into the silicon melt, so as to attain the above nitrogen concentration. It should be noted that the nitrogen concentration in the silicon single crystal and the nitrogen concentration in the resultant silicon single crystal wafer are substantially the same.

For the description of the oxygen concentration in the silicon single crystal wafer according to the present invention, a value calculated by using a conversion factor ($3.03\times10^{17}$/cm$^2$) of Japan Electronics and Information Technology Industries Association (JEITA) is used. Specifically, a standard measurement method of inter-lattice oxygen atom concentration in the silicon crystal by infrared absorption (former JEIDA-61) is used. It is preferable that the oxygen concentration is set to be not more than $8.0\times10^{17}$ atoms/cm$^3$, more preferably not more than $7.0\times10^{17}$ atoms/cm$^3$, and still more preferably $5.0\times10^{17}$ to $7.0\times10^{17}$ atoms/cm$^3$. When the oxygen concentration is less than or equal to $8.0\times10^{17}$ atoms/cm$^3$, high C-mode non-conforming defects are suppressed. In addition, an oxygen concentration of lower than $5.0\times10^{17}$ atoms/cm$^3$ is not preferable, because an extreme decrease in yield in crystal pulling cannot be avoided. It should be noted that the oxygen concentration in the silicon single crystal, and the oxygen concentration in the resulting silicon single crystal wafer are substantially the same. During crystal pulling, oxygen is dissolved from the quartz crucible holding the silicon melt and transferred into the melt and into the growing silicon single crystal.

The step of doping the silicon single crystal with hydrogen according to the present invention preferably comprises introducing hydrogen gas into an atmosphere of the pulling furnace during pulling the silicon single crystal, or adding water, acid, or a hydrocarbon such as alcohol, $CH_4$, $C_2H_4$, etc. The partial pressure of hydrogen in the crystal pulling furnace is set to 3 to 60 Pa, preferably 3 to 60 Pa, more preferably 20 to 50 Pa, and still more preferably 35 to 45 Pa.

When the relevant hydrogen partial pressure is 3 Pa or more, the ratio of voids composing bubble-like shaped aggregates of voids to the total number of voids becomes 50% or more, and in particular, in the case where the partial pressure is 35 Pa or more, the ratio becomes 60% or more. In addition, when the partial pressure is less than or equal to 60 Pa, because there is little overlap of the OSF region and the V2 region, it is possible to attain a high C-mode acceptance rate (C-mode good product rate) which is 80% or more over nearly the whole surface of the resultant silicon single crystal wafer.

The carbon concentration in the silicon single crystal wafer according to the present invention is $1\times10^{15}$ to $9\times10^{15}$ atoms/cm$^3$, and the preferable carbon concentration is $3\times10^{15}$ to $5\times10^{15}$ atoms/cm$^3$.

When the carbon concentration is $3\times10^{15}$ to $5\times10^{15}$ atoms/cm$^3$, it becomes relatively easy to convert the whole wafer surface to the V2 region, and in addition, by setting the hydrogen partial pressure at 35 to 45 Pa, it becomes possible to attain high C-mode acceptance rate which is 90% or more. It should be noted that the carbon concentration in the silicon single crystal and the carbon concentration in the resultant silicon single crystal wafer are substantially the same.

Figure 6:
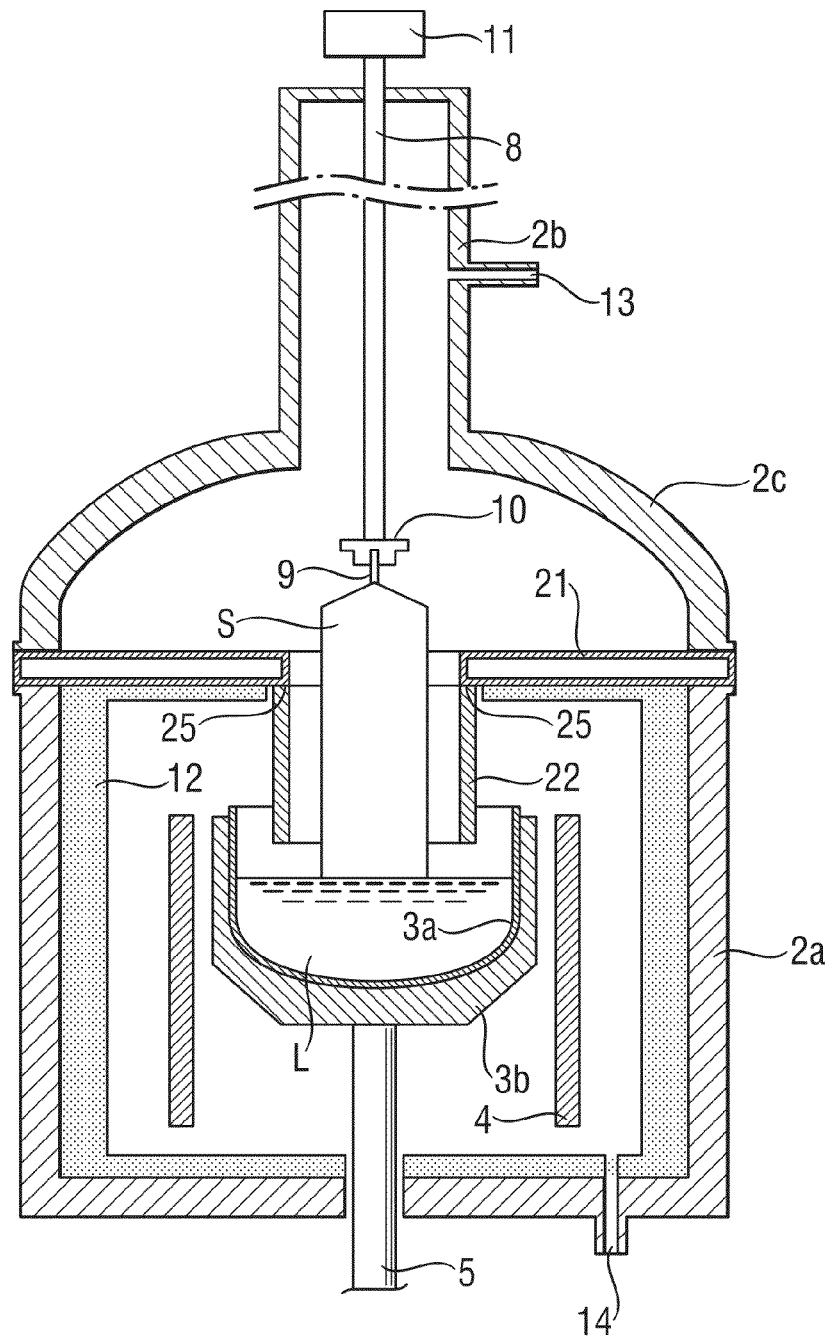
FIG. 6 is a schematic cross-sectional view showing an example of a single crystal pulling furnace used in the present invention.

Now, a single crystal production apparatus capable of carrying out the above mentioned "rapid cooling" treatment will be described with reference to an example. FIG. 6 is a schematic cross-sectional view showing an example of a single crystal production apparatus used in the present invention. The single crystal production apparatus shown in FIG. 6 comprises a member for melting a semiconductor material and a mechanism for pulling a grown single crystal. The member for melting the semiconductor material is accommodated inside a heating chamber 2a, and the mechanism for pulling the grown single crystal is installed at the inside and outside of a pulling chamber 2b constituting a part of an upper part structured body, which is designed to be separable from this heating chamber 2a. This upper part structured body has also a middle chamber 2c.

Inside the heating chamber 2a, a crucible for accommodating a melt L is installed, and this crucible is supported so as to be freely rotatable and freely descended and ascended by a rotation shaft 5. The rotation shaft 5 is rotated, and descended and ascended by a drive apparatus not shown. The drive apparatus ascends the crucible when the liquid surface is lowered, so as to compensate the liquid surface lowering accompanying the pulling of a single crystal S. In addition, the drive apparatus always rotates the crucible with a predetermined rotation rate to carry out stirring of the melt L. The crucible is constituted by a quartz crucible 3a, and a graphite crucible 3b for supporting the quartz crucible. At the side wall part of the crucible, a heater 4 to melt silicon is arranged so as to surround the circumference of the crucible. At the outside of heater 4, a heat insulator 12 is installed so as to surround the circumference, and to prevent heat from heater 4 radiating directly to the heating chamber 2a.

In the pulling chamber 2b, a pulling wire 8 is installed, wherein one end thereof is attached at a wire winding-up machine 11 and which wire is hanging down by penetrating through a top wall of a ceiling part of the middle chamber 2c, and a chuck 10 for holding a seed crystal 9 is attached at the lower end of this pulling wire 8. The wire winding-up machine 11 pulls up the single crystal S, gradually growing at the lower end side of the seed crystal 9 according to growing speed thereof. At the same time, the winding-up machine 11 always rotates the single crystal S in an opposite direction to a rotation direction of the crucible.

From a gas introduction entrance 13 formed at an accommodation part of the pulling chamber 2b, argon gas is introduced, and this argon gas is designed to be discharged from a gas discharge exit 14, after passing through the inside of the heating chamber 2a. The reason for passing argon gas through inside the chamber in this way is to prevent mixing of SiO gas or CO gas with the silicon melt. SiO gas and CO gas are generated inside the chamber due to melting of silicon with the heater 4.

Above the crucible, a liquid cooling structured body 21 and a cooling body 22 are arranged in the chamber so as to surround the growing single crystal. The liquid cooling structured body 21 is a structured body having liquid coolant passing through inside thereof. In FIG. 6, the liquid cooling structured body 21 is constituted as a water cooling member made of stainless steel, and water is used as a coolant.

The cooling body 22 is composed of a material with high thermal conductivity and arranged so as to cool the growing single crystal S. A material composing the cooling body 22 may be selected from substances with high thermal conductivity and high heat radiation rate, for example, silver, silver alloys, carbon or copper and the like, but it is most preferable to use silver or silver alloys, as such a material has high thermal conductivity and at the same time lacks the risk of contaminating the melt or the single crystal. Coating gold or silver or alloys thereof on the surface of a cooling body made of copper or copper alloys may also be adopted.

The liquid cooling structured body 21 and the cooling body 22 are jointed by explosive bonding, and the jointed part constitutes an explosive bonding jointed part 25. For explosive bonding, materials to be jointed are arranged in parallel at a suitable interval apart. By putting suitable amount of explosive on either of the materials via a buffering material and by initiating one end thereof with a detonator, both materials collide with progress of explosion, and at the explosion point, both metal materials show viscous fluid-like behaviour by very large deformation speed and high pressure to generate metal jet flow from the explosion point to the forward. By this metal jet, the oxide film or gas adsorption layer at the metal surface is removed, therefore a clean surface appeared adheres closely by high pressure, and both materials joint completely metallurgically.

Since the jointed part between the cooling body 22 and the liquid cooling structured body 21 is jointed by explosive bonding, a good jointed part is formed in spite of a joint part between different metals, and furthermore, nearly 100% of contact rate can be secured in the contact area. Therefore, heat conduction from the cooling body 22 to the liquid cooling structured body 21 becomes extremely good, which allows the temperature of the cooling body 22 to decrease.

The cooling body 22 is arranged at a position for shielding radiation heat from the crucible or the melt L to the single crystal S, with a nearly rotationally symmetrical shape to the center axis of the growing single crystal S, and is jointed to the liquid cooling structured body 21 at the upper end part of the cooling body 22.

In FIG. 6, the cooling body 22 is drawn in a cylindrical shape, and contact area of the explosive bonding jointed part 25 between the cooling body 22 and the liquid cooling structured body 21 has nearly the same area of cross-sectional area of a main cooling body. The surface of the cooling body 22 has the property capable of absorbing the incident heat radiation, by making the inside of the cooling body 22 facing the single crystal S black. In addition, the outside of the cooling body 22 facing the crucible or a heat shielding body 26, may be a surface with high reflectance so as to reflect the incident heat radiation.

The liquid cooling structured body 21 is a water cooling chamber of a doughnut-type shape, and is arranged between the middle chamber 2c and the heating chamber 2a.

First, in producing the single crystal S, the upper part structured body, having the pulling chamber 2b, the middle chamber 2c and the liquid cooling structured body 21, which is explosive bonding jointed with the cooling body 22, is separated from the heating chamber 2a, then polycrystalline silicon raw material and trace amounts of impurities, which will become dopants, are charged into the crucible, and then the upper part structured body is attached at the heating chamber 2a again. In this state, the inside of the crucible is heated with the heater 4, until the semiconductor material in the crucible is melted. When the semiconductor material has reached a molten state, the pulling wire 8 is descended by actuation of the wire winding machine 11, so that the seed crystal 9 attached at the chuck 10 is subjected to contacting with the surface of the melt L. When the single crystal S starts to grow onto the seed crystal 9 in this state, then the wire winding up machine 11 is retracted at a predetermined speed to grow the single crystal S.

In this way, in the process for growing the single crystal S by pulling from the melt L, radiation heat from the single crystal S is injected to the cooling body 22 composed of a material with high thermal conducting material. In this case, since the cooling body 22 is explosive bonding jointed with the liquid cooling structured body 21, which is cooled with a liquid coolant and thus maintained at low temperature, radiation heat exchange with the single crystal S becomes good, and it becomes possible to increase the cooling rate of the single crystal S. At the same time, because it is possible to quench the single crystal S during pulling-up, generation of crystal defects in the single crystal S becomes extremely rare.

After the single crystal S has been pulled and cooled, a silicon single crystal wafer is cut from the single crystal and, if desired, subjected to various conditioning treatments like polishing so that a mirror polished wafer is obtained. Then, a precipitation heat treatment may be performed to precipitate oxygen, in order to obtain a BMD density of a degree which is necessary for gettering in a device process. The conditions of such heat treatment are not especially limited, as long as the desired BMD density can be obtained. However, the heat treatment is preferably performed at a temperature from 700 to 1000° C. for 1 to 30 hours. In addition, such heat treatment may be performed under a constant treatment temperature or a constant treatment time, or may be performed in two stages where at least one of them is changed during the treatment, and for example, a heat treatment described in JP-A-2007-176732 can be performed. It should be noted that, in the precipitation heat treatment adopted as a measurement method for BMD density in the above description, the two-stage heat treatment is performed. Furthermore, an epitaxial layer may be formed at the surface of the mirror polished wafer by known methods.

Subsequently, an explanation of the rapid cooling treatment will be given which is performed with a predetermined temperature gradient and a predetermined pulling speed, during the crystal pulling.

The temperature gradient in a longitudinal direction of the silicon crystal within a temperature range from 1100 to 1200° C. is set to be 3.5° C./mm or more during the pulling of the silicon single crystal. When the temperature gradient is 3.5° C./mm or more, and when the pulling is decreased to a certain degree, the above mentioned V2 region between the void region and the OSF region will appear over a wide range. It is speculated that the appearance of the V2 region is caused by the interaction of point defects at temperatures in the region of 1100 to 1200° C. The temperature gradient is preferably 3.5 to 5.0° C./mm, more preferably 3.5 to 4.8° C./mm, and still more preferably 3.8 to 4.2° C./mm. By setting the temperature gradient within the above mentioned very limited ranges, the "rapid cooling" results in a low void density, and the voids compose bubble-like shaped aggregates which have nearly no adverse influence on the semiconductor device. In addition, the single crystal can be pulled stably and easily at relatively low pulling speed. In particular, setting the upper limit of the above mentioned temperature gradient at 5.0° C./mm is suitable, because crystal growth is stable, even at a relatively low pulling speed.

According to the present invention, the crystal pulling speed is controlled by specifying a ratio of the V1 region or the V2 region occupying the total area of the silicon wafer. Specifically, the upper limit value of the crystal pulling speed is a value when the V1 region becomes 20% of the total area of the silicon wafer. On the other hand, the lower limit value of the crystal pulling speed is a value when the V2 region becomes 80% of the total area of the silicon wafer. The upper limit value is preferably a value when the V1 region becomes 0% of the total area of the silicon wafer, and the lower limit value is preferably a value when the V2 region becomes 80% of the total area of the silicon wafer. The upper limit value is still more preferably a value when the V1 region becomes 0% of the total area of the silicon wafer, and the lower limit value is still more preferably a value when the V2 region becomes 100% of the total area of the above silicon wafer. In this case, the whole surface of the wafer becomes the V2 region.

In more detail, the control of the crystal pulling speed by such setting of the upper limit value and the lower limit value, is carried out by controlling a size (width) of the V1 region and the V2 region, along with the OSF region. Control of the size (width) of the V1 region and the V2 region is as described above. Control of the size (width) of the OSF region depends on the degree of shrinkage of the OSF region.

Figure 7:
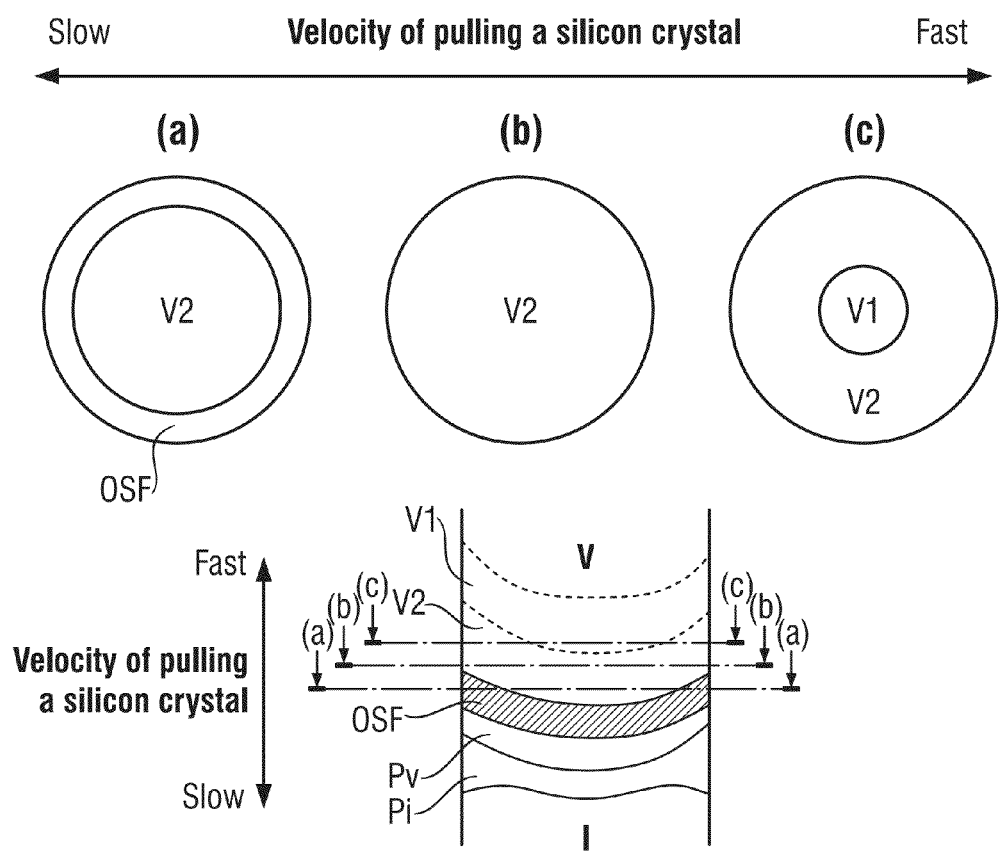
FIG. 7 is a drawing showing the relationship between the pulling speed and the defect region formation in the silicon crystal.

FIG. 7 is a drawing showing the relation between the pulling speed and the occurrence of a defect region in the silicon single crystal. The lower part of FIG. 7 is a drawing showing a cross-section of a pulled single crystal. Cross-sections from the single crystal taken at points (a), (b) and (c) are shown in the upper part of FIG. 7. It has been found that any of the cross-sections at points (a), (b) and (c) has an area ratio of the V2 region of equal to or higher than 80%, and that a total area ratio of the V1 region plus the OSF region is equal to or lower than 20%. That is, the points (a) and (c) are boundaries, and the cross-section where the V1 region is 20% of the total area of the silicon wafer represents the upper limit value of the crystal pulling speed, and the cross-section where the V2 region is 80% of the total area of the above mentioned silicon wafer represents the lower limit value of the crystal pulling speed. Therefore, the cross-sections at points (a) and (c) and any cross-sections between these both ends refer to silicon single crystal wafers obtained by the present invention.

In addition, a numerical range of the crystal pulling speed (V) according to the present invention is 0.53 to 0.68 mm/minute, preferably 0.53 to 0.63 mm/minute, and more preferably 0.56 to 0.63 mm/minute. Each of these three ranges corresponds to a range, a preferable range and a more preferable range, respectively, defined in terms of the ratio of the V1 region or the V2 region occupying the total area of the above mentioned silicon wafer. A crystal pulling speed which is equal to or lower than 0.87 mm/minute enables avoiding a state where the whole surface of the silicon wafer becomes the V1 region, and enables generation the V2 region. Therefore, it not only provides extremely good GOI of the oxide film but also the high C-mode pass rate (C-mode conforming rate) of 70% or more. On the other hand, a crystal pulling speed which is 0.40 mm/minute or more enables avoiding a state where the whole surface of the above silicon wafer becomes the OSF region, and provides the high C-mode pass rate (C-mode conforming rate) of 70% or more.

The measurement of the GOI of the oxide film (calculation of high C-mode pass rate) was carried out as follows. At the surface of a substrate (wafer) after heat treatment, the oxide film with a thickness of 25 nm was formed under dry oxygen atmosphere at 1000° C., and the GOI of the oxide film was measured. A number of 164 polysilicon electrodes with an area of 20 mm$^2$ were used for the measurement of the GOI at the wafer surface. The ratio of the electrodes, showing breakdown voltage of a test current of 100 mA and an electric field intensity of 11 MV/cm or more, is defined as the high C-mode pass rate, and a high C-mode pass rate of 70% or more is judged "good".

According to the Voronkov theory (V. V. Voronkov; Journal of Crystal Growth, 59 (1982) 625 to 643), a parameter V/G, which is the ratio of the crystal pulling speed (V) and the average temperature gradient in a crystal growth longitudinal direction (G), determines type and total concentration of a micro defects (point defects). Here, G is defined as the average temperature gradient in a crystal growth longitudinal direction from the melting point to 1350° C. Therefore, because control of the crystal pulling speed in the present embodiment can be specified also by calculation of V/G, it will be explained below.

A relative V/G value was defined as follows. A pulling furnace having the same structure as the pulling furnace for pulling-up a silicon single crystal doped with nitrogen, carbon and hydrogen, was used for pulling-up a silicon single crystal which was not doped with nitrogen, carbon and hydrogen at various pulling speed V. Then, a wafer was cut from the pulled crystal to be subjected to precipitation heat treatment at 780° C. for 3 hours, and subsequently at 1000° C. for 16 hours, and then the BMD density was measured with a BMD analyzer. A region having a BMD density of greater than or equal to $1 \times 10^8/cm^3$ was defined as a V-rich region comprising the Pv region, the OSF region and the V region; a region having a BMD density of below $1 \times 10^8/cm^3$ was defined as an I-rich region comprising the Pi region and the I region; and a boundary between the V-rich region and the I-rich region was defined as a V-I boundary. The V/G value at the position of the V-I boundary was defined as $(V/G)_{crit}$.

The absolute value of V/G cannot be determined unless the absolute value of G is known. However, by defining the relative V/G, where V/G is standardized by $(V/G)_{crit}$, it is considered that when the relative V/G is larger than 1, the defect region becomes the V-rich region, while when the relative V/G is smaller than 1, the defect region becomes the I-rich region. By examination of relationship between the pulling speed and the V-I boundary position in advance, the relative V/G value of a crystal pulled at a certain pulling speed, can be determined by using a pulling furnace with the same structure.

Figure 9:
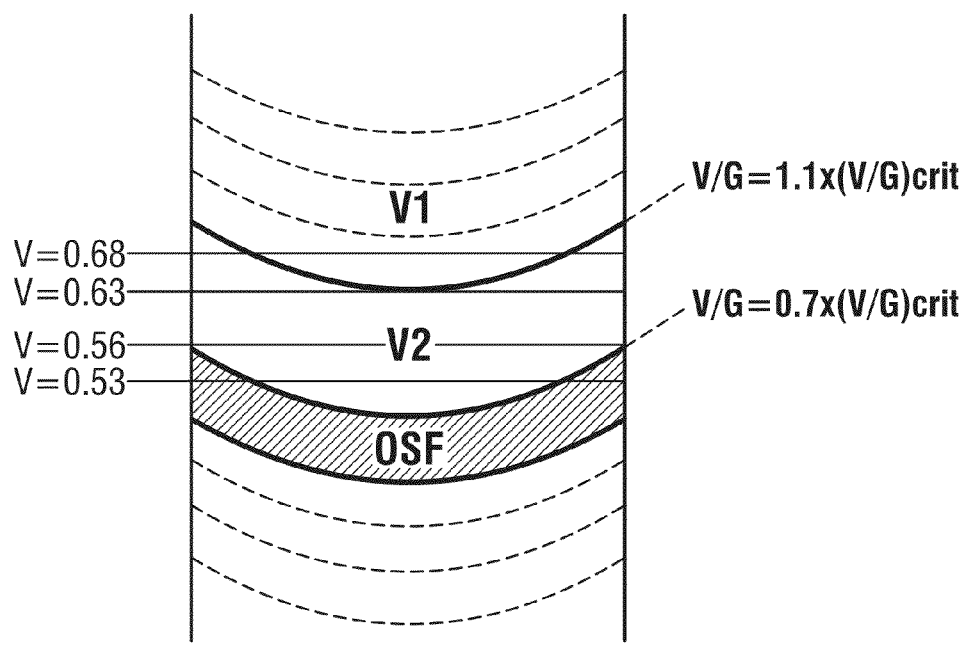
FIG. 9 is a drawing showing the relationship between the V1 region and the V2 region, and V/G and V in a silicon crystal.

A method for controlling the V1 region and the V2 region by V/G is as follows. In the present embodiment shown in (F) of FIG. 1, the V1 region appears where V/G is in a range of equal to or higher than $1.1 \times (V/G)_{crit}$. In addition, the V2 region appears where V/G is in a range of $1.1 \times (V/G)_{crit}$ to $0.7 \times (V/G)_{crit}$. Therefore, the present invention comprises a silicon single crystal wafer having a defect region representing a V/G which is greater than or equal to $1.1 \times (V/G)_{crit}$ and which occupies an area which is less than or equal to 20% of the total area of the silicon wafer, and having a defect region representing a V/G which is $1.1 \times (V/G)_{crit}$ to $0.7 \times (V/G)_{crit}$ which occupies an area of the silicon wafer which is 80% or more of the total area of the silicon wafer. More preferably, the silicon single crystal wafer has a defect region which occupies the whole surface of the wafer and which represents a region where V/G is less than or equal to $1.1 \times (V/G)_{crit}$ and has a defect region which occupies an area which is 80% or more of the total area of the silicon wafer and represents a region where V/G is $1.1 \times (V/G)_{crit}$ to $0.7 \times (V/G)_{crit}$. Still more preferably, the silicon single crystal wafer has a defect region which occupies the whole surface of the wafer and represents a V/G which is $1.1 \times (V/G)_{crit}$ to $0.7 \times (V/G)_{crit}$. The relationship between the V1 region and the V2 region, and between the V/G and V in the silicon crystal is shown in FIG. 9.

Explanation will be given below on a cross relationship among voids and in-plane OSF distribution in the silicon crystal, along with high C-mode pass rate.

The present inventors have examined the mutual relationship between voids and in-plane OSF distribution in the silicon crystal, along with high C-mode pass rate. The voids and in-plane OSF distribution in the silicon crystal are measured by using the above mentioned commercial defect evaluation apparatus, an LSTD scanner (MO-6) manufactured by Raytex Co. The measurement conditions were as described above. From the area density ($[/cm^2]$) of the voids and OSF measured, and the measurement depth of 5 μm, the volume density ($[/cm^3]$) of the voids was calculated. The experiments included case [B] representing doping with nitrogen, only, i.e. no hydrogen doping, no carbon doping and no "rapid cooling" treatment according to the present invention; case [D] representing doping with nitrogen and the "rapid cooling" treatment according to the present invention, i.e. no doping with hydrogen and no doping with carbon; and case [F] doping with nitrogen, carbon and hydrogen and the "rapid cooling" treatment according to the present invention.

Figure 8:
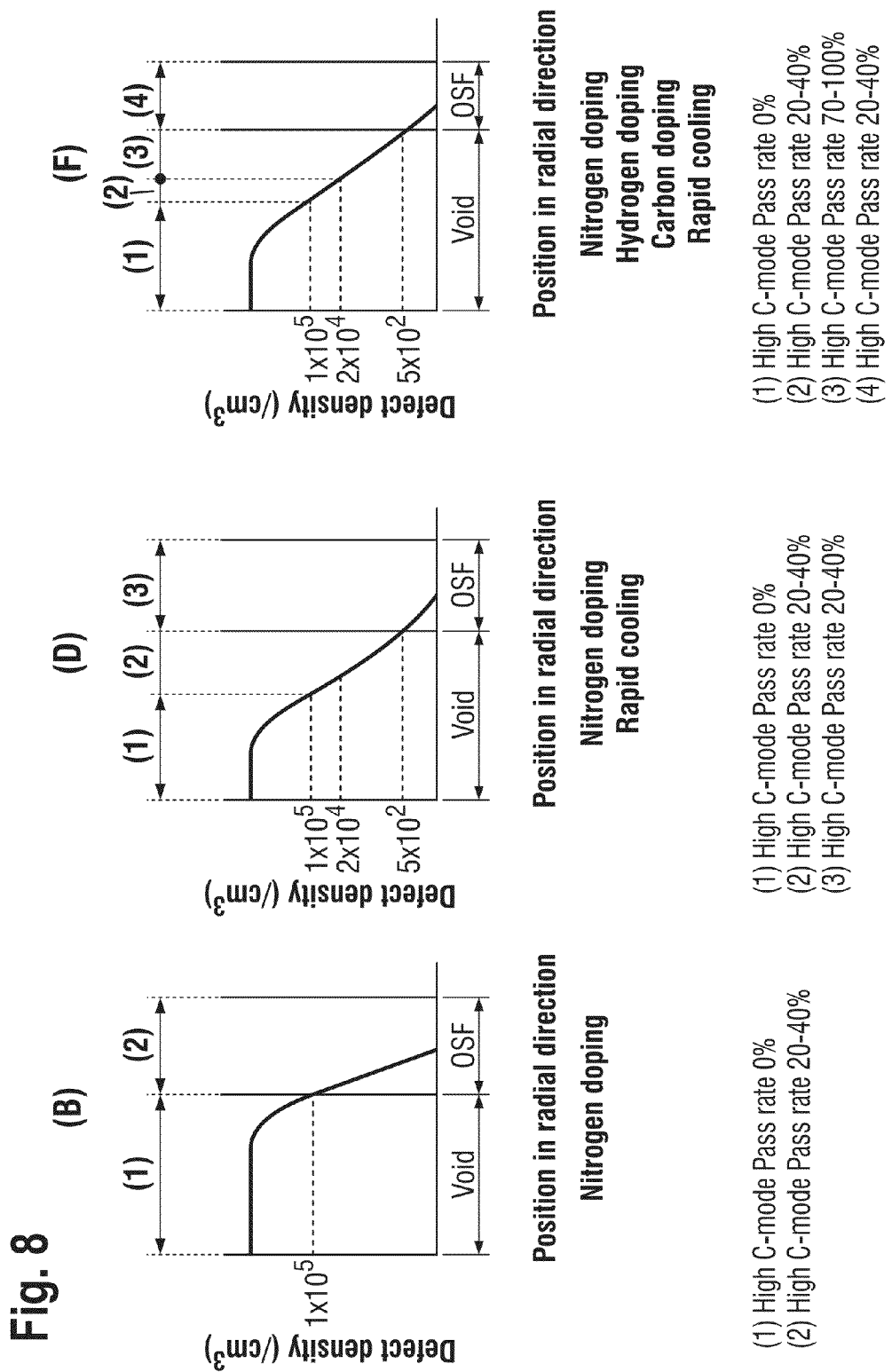
FIG. 8 is a graph showing investigative results on the relationship between in-plane distribution of voids and OSF in a silicon crystal, along with high C-mode pass rate.

FIG. 8 shows the examination results regarding the relation between the voids and in-plane OSF distribution in the silicon crystal, and the corresponding C-mode pass rates. The conditions for cases [B], [D] and [F] are summarized in the following Table 2.

TABLE 2

|  | [B] | [D] | [F] |
| --- | --- | --- | --- |
| Nitrogen doping | Yes | Yes | Yes |
| Hydrogen doping | No | No | Yes |
| Carbon doping | No | No | Yes |
| Rapid cooling treatment | No | Yes | Yes |

As shown in FIG. 8, a region having a void density ($[/cm^3]$) in a range of $5 \times 10^2$ to $2 \times 10^4/cm^3$ and a good high C-mode pass rate (70 to 100%) was found in case [F], only. The Other regions had a lower high C-mode pass rate which was only 20 to 40%.

The diameter of the above mentioned silicon single crystal and the pressure inside the crystal pulling furnace may be set at predetermined values.

In principle, the diameter of the silicon single crystal is not limited. However, the diameter is preferably set to be equal to or larger than 200 mm. When the diameter is equal to or larger than 200 mm, the present invention is particularly suitable, since silicon single crystal wafers with a diameter of equal to or larger than 200 mm are mainly used for manufacturing devices such as DRAM.

The pressure inside the crystal pulling furnace is set to be 40 to 250 mbar. The lower limit is 40 mbar or higher, preferably 60 mbar or higher, and more preferably 80 mbar or higher, to effectively avoid a decrease of the product yield during pulling of the single crystal. The higher limit value is less than or equal to 250 mbar, preferably less than or equal to 150 mbar, and more preferably less than or equal to 100 mbar which effectively avoids a decrease of product yield during pulling of the single crystal.

Explanation of the present invention will be given below by means of examples. However, the present invention should not be limited to the following examples. That is, the following examples are only exemplifications, and any one, which has substantially the same constitution as technological concept described in the claims of the present invention and exerts similar action and effect, should be included in technological scope of the present invention.

EXAMPLE 1

Pulling of a silicon single crystal was carried out by using a silicon crystal production apparatus. The silicon crystal production apparatus used in the present example is a single crystal production apparatus having the cooling body 22 shown in FIG. 6. Such an apparatus is used in producing a silicon crystal by the usual CZ method. The crucible diameter was 22 inch, the weight of semiconductor material to be inserted into the crucible was 100 kg, and the single crystal S was an 8 inch crystal (200 mm).

As a material for the cooling body 22, silver was used, and the cooling body 22 had an inner diameter of 260 mm, an outer diameter of 300 mm, and a length of 280 mm. As the liquid cooling structured body 31, a constitution of a doughnut-shaped water cooling chamber having a cooling water pipeline inside was used, and the liquid cooling structured body 31 was attached at the lower part of the middle chamber 2c.

The aforesaid production apparatus was configured as a pulling furnace 1 or a pulling furnace 2, where the heat shielding body 36 was cooled by the above mentioned method to increase the temperature gradient within the temperature range of 1100° C. to 1200° C., or as a pulling furnace 3 causing a common temperature gradient in the respective temperature range. In the pulling furnace 1 and the pulling furnace 2, the joint between the cooling body 22 and the liquid cooling structured body 21 was prepared by explosive bonding. On the other hand, in the pulling furnace 3, the joint between the cooling body 22 and the liquid cooling structured body 21 was bolt-jointed.

In the pulling furnace 1, the temperature gradient in a longitudinal direction of a crystal within the temperature range from 1100 to 1200° C. was set to be 4° C./mm during pulling the crystal, the temperature gradient was set to be 5° C./mm in the pulling furnace 2, and the temperature gradient was set to be 3° C./mm in the pulling furnace 3. The type of pulling furnace (item "Pull-up furnace" in Table 3) and the temperature gradients in each of Examples and Comparative Examples, are described in the following Table 3.

The conduction type of the silicon crystal grown by utilization of this apparatus was p-type (boron doping), and the crystal diameter was 200 mm (8 inch).

Nitrogen doping was carried out by charging a wafer having a nitride film into silicon melt. The nitrogen concentration of the silicon wafer obtained by slicing the pulled silicon single crystal was measured using a secondary ion mass spectrometer (SIMS). The oxygen and carbon concentrations were measured by an infrared absorption method, and the respective value of JETTA (Japan Electronics and Information Technology Industries Association) was used as a conversion factor. That is, the conversion factor for interstitial oxygen concentration is $3.03 \times 10^{17}/cm^2$, and the conversion factor for carbon concentration is $8.1 \times 10^{16}/cm^2$. However, because a wafer having a nitrogen concentration of equal to or lower than $5 \times 10^{14}$ atoms/cm$^3$ cannot be measured using SIMS, the nitrogen concentration was determined by using Expression 1 which is specified below.

Any known method may be used for doping the silicon single crystal with nitrogen; for example, nitrogen gas is introduced and dissolved in the silicon melt; or a silicon substrate with a nitride deposited thereon by a CVD method or the like is mixed with the silicon raw material before or after melting of the silicon raw material. The segregation coefficient, k, which is the ratio of the impurity concentration in the crystal after solidification to the impurity concentration in the melt, has the value of $7 \times 10^{-4}$, in the case of nitrogen (W. Zulehner and D. Huber, Crystal Growth, Properties and Applications, p 28, Springer-Verlag, New York, 1982).

The nitrogen concentration of a silicon single crystal wafer which is produced according to the present invention, can be calculated by Nitrogen concentration in a wafer=$k \times$(1−solidification rate)$^{(k-1)} \times$nitrogen concentration in the melt.  Expression 1

It should be noted that the nitrogen concentration in the melt means the nitrogen concentration in the initial melt. Here, solidification rate (g/g) of the silicon crystal can be determined by:

Solidification rate (g/g) of the silicon crystal=(weight of crystallized silicon)/(weight of the initial melt)  Expression 2

The measured value [atoms/cm$^3$] of the nitrogen concentration are described in the following Table 3.

In addition, hydrogen doping was carried out by the introduction of a hydrogen containing gas mixture into each of the pulling furnaces. The hydrogen partial pressure [Pa] and some of the conditions set are described in the following Table 3.

The crystal pulling speed V and the in-plane distribution of G were controlled as follows. First, the crystal pulling speed was limited to an upper limit value such that the V1 region having a void density of over $2 \times 10^4/cm^3$ and below $1 \times 10^5/cm^3$ was controlled so as to be equal to or less than 20% of total area of a silicon single crystal wafer cut from the pulled-up silicon single crystal. Second, the crystal pull-up speed was limited to a lower limit value such that the V2 region having the void density of over $5 \times 10^2/cm^3$ and below $2 \times 10^4/cm^3$ was controlled so as to be equal to or more than 80% of total area of a silicon single crystal wafer cut from the pulled-up silicon single crystal. The values of the crystal pulling speed, the in-plane V/G maximal values (V/G at the wafer center), and the V/G minimal values (V/G at the wafer edge) are as described in the following Table 3. It should be noted that V/G in Table 3 is standardized by $(V/G)_{crit}$. A plurality of wafers were cut from the same position of the single crystal and converted to mirror polished wafers.

The V region of a wafer is a region in which voids are formed as a result of introduction of excess vacancy point defects from a solid-liquid interface during crystal growth. Therefore, specifically, the V region of the substrate can be specified by the above mentioned void density.

The evaluation and identification of the void region inside the wafers was carried out by the above mentioned method. In addition, as described above, volume density of the voids was calculated, to determine the V1 region and the V2 region. The inner diameter and the outer diameter [cm] of the V1 region and the V2 region determined in this way are described in the following Table 3.

The evaluation of OSF was carried out by the following method. First, the wafer was subjected to an oxidation treatment under oxygen atmosphere containing steam at 1100° C. for 1 hour. After that, an oxide film was removed with hydrofluoric acid, and then etched by a thickness of 1.5 μm, with a light etching liquid, to observe ellipse-like, half moon-like or rod-like OSF pits generated at the surface with an optical microscope. The OSF area density [piece/cm$^2$] was determined as [OSF pits number/observation area] by scanning the wafer in a diameter direction and by counting the number of OSF pits in a view field of 2.5 mm diameter with an optical microscope. The OSF region was defined as a region having an OSF area density of 100 pieces/cm² or more. The inner diameter and outer diameter [cm] of the OSF region determined in this way, are described in the following Table 3.

Furthermore, as for each of oxygen concentration, ratio of the number of voids composing bubble-like shaped aggregates of voids to the total number voids (Void Ratio), the BMD density and the high C-mode pass rate, the respective values measured by the above mentioned methods are described in Table 3.

EXAMPLE 2

A silicon single crystal was pulled similarly as in Example 1, except that conditions of oxygen concentration, nitrogen concentration, carbon concentration, pulling speed, along with minimal value and maximal value of V/G were set as described in Table 3.

EXAMPLE 3

A silicon single crystal was pulled similarly as in Example 1, except that conditions of oxygen concentration, nitrogen concentration, carbon concentration, pulling speed, along with minimal value and maximal value of V/G were set as described in Table 3.

EXAMPLE 4

A silicon single crystal was pulled similarly as in Example 1, except that conditions of oxygen concentration, nitrogen concentration, carbon concentration, pulling speed, along with minimal value and maximal value of V/G were set as described in Table 3.

EXAMPLE 5

A silicon single crystal was pulled similarly as in Example 1, except that conditions of oxygen concentration, carbon concentration, pulling speed, along with minimal value, partial pressure of hydrogen and maximal value of V/G were set as described in Table 3.

EXAMPLE 6

A silicon single crystal was pulled similarly as in Example 1, except that conditions of oxygen concentration, carbon concentration, pulling speed, along with minimal value, partial pressure of hydrogen and maximal value of V/G were set as described in Table 3.

EXAMPLE 7

A silicon single crystal was pulled similarly as in Example 1, except that conditions of oxygen concentration, carbon concentration, pulling speed, along with minimal value and maximal value of V/G were set as described in Table 3.

EXAMPLE 8

A silicon single crystal was pulled similarly as in Example 1, except that conditions of oxygen concentration, carbon concentration, pulling speed, along with minimal value, pulling furnace and maximal value of V/G were set as described in Table 3.

Comparative Examples 1~7

A silicon single crystal was pulled-up similarly as in Example 1, except that conditions of oxygen concentration, nitrogen concentration, carbon concentration, pulling speed, along with minimal value, pulling furnace, partial pressure of hydrogen, and maximal value of V/G were set as described in Table 3.

Results of the above Examples and Comparative Examples are shown in Table 3.

TABLE 3

| Classification | Nitrogen concentration [atoms/cm³] | Carbon concentration [atoms/cm³] | Oxygen concentration [atoms/cm³] | velocity of pulling [mm/min] | V/G min. | V/G max. | Furnace | Temp. gradient [° C./mm] | Hydrogen partial pressure [Pa] | Void Ratio [%] |
|---|---|---|---|---|---|---|---|---|---|---|
| Example 1 | 2.0E+14 | 8.0E+15 | 6.8E+17 | 0.54 | 0.68 | 0.93 | 1 | 4 | 40 | 70 |
| Example 2 | 3.0E+14 | 4.0E+15 | 6.9E+17 | 0.56 | 0.71 | 0.97 | 1 | 4 | 40 | 90 |
| Example 3 | 1.0E+15 | 4.0E+15 | 6.7E+17 | 0.67 | 0.84 | 1.16 | 1 | 4 | 40 | 80 |
| Example 4 | 7.0E+13 | 3.0E+15 | 6.8E+17 | 0.62 | 0.78 | 1.07 | 1 | 4 | 40 | 80 |
| Example 5 | 2.0E+14 | 5.0E+15 | 6.9E+17 | 0.61 | 0.77 | 1.06 | 1 | 4 | 5 | 50 |
| Example 6 | 2.0E+14 | 4.1E+15 | 6.6E+17 | 0.62 | 0.78 | 1.07 | 1 | 4 | 60 | 80 |
| Example 7 | 2.0E+14 | 1.5E+15 | 6.9E+17 | 0.62 | 0.78 | 1.07 | 1 | 4 | 40 | 70 |
| Example 8 | 2.0E+14 | 4.0E+15 | 6.9E+17 | 0.61 | 0.77 | 1.06 | 2 | 5 | 40 | 90 |
| Comparative Example 1 | 3.0E+14 | 4.2E+15 | 6.8E+17 | 0.70 | 0.88 | 1.21 | 1 | 4 | 40 | 70 |
| Comparative Example 2 | 3.0E+14 | 3.8E+15 | 6.7E+17 | 0.48 | 0.60 | 0.83 | 1 | 4 | 40 | 60 |
| Comparative Example 3 | 2.0E+14 | 4.3E+15 | 6.9E+17 | 0.70 | 0.88 | 1.21 | 1 | 4 | No addition | 0 |
| Comparative Example 4 | 2.0E+14 | 4.1E+15 | 6.6E+17 | 0.61 | 0.77 | 1.06 | 1 | 4 | 100 | 80 |
| Comparative Example 5 | 3.1E+14 | No addition | 6.8E+17 | 0.53 | 0.67 | 0.92 | 1 | 4 | 40 | 60 |
| Comparative Example 6 | 2.0E+14 | 5.6E+15 | 6.9E+17 | 0.50 | 0.63 | 0.87 | 3 | 3 | 40 | 60 |
| Comparative Example 7 | 4.0E+15 | 6.1E+15 | 6.7E+17 | 0.53 | 0.67 | 0.92 | 1 | 4 | 40 | 100 |

TABLE 3-continued

| Classification | Radius of V1 area Inside [mm] | Radius of V1 area outside [mm] | Radius of V2 area Inside [mm] | Radius of V2 area outside [mm] | Radius of OSF area Inside [mm] | Radius of OSF area outside [mm] | BMD minimum value [/cm$^3$] | Pass rate of high C mode [%] | Remarks |
|---|---|---|---|---|---|---|---|---|---|
| Example 1 | — | — | 0 | 94 | 94 | 100 | 2.1E+09 | 89 | |
| Example 2 | — | — | 0 | 100 | — | — | 2.9E+09 | 92 | |
| Example 3 | 0 | 38 | 38 | 100 | — | — | 3.4E+09 | 76 | |
| Example 4 | — | — | 0 | 100 | — | — | 6.8E+08 | 91 | |
| Example 5 | — | — | 0 | 100 | — | — | 1.2E+09 | 83 | |
| Example 6 | — | — | 0 | 92 | 92 | 100 | 2.1E+09 | 85 | |
| Example 7 | — | — | 0 | 95 | 95 | 100 | 1.5E+09 | 86 | |
| Example 8 | — | — | 0 | 100 | — | — | 3.9E+09 | 91 | unstable pulling |
| Comparative Example 1 | 0 | 52 | 52 | 100 | — | — | 1.8E+09 | 32 | |
| Comparative Example 2 | — | — | 0 | 70 | 70 | 100 | 2.1E+09 | 65 | |
| Comparative Example 3 | 0 | 16 | 16 | 51 | 51 | 100 | 1.8E+09 | 53 | |
| Comparative Example 4 | 0 | 38 | — | — | 38 | 100 | 2.1E+09 | 43 | |
| Comparative Example 5 | — | — | 0 | 22 | 22 | 100 | 1.1E+09 | 62 | |
| Comparative Example 6 | 0 | 94 | — | — | 94 | 100 | 1.2E+09 | 20 | |
| Comparative Example 7 | — | — | — | — | 0 | 100 | 8.2E+09 | 45 | |

From Table 3, the high C-mode pass rate of any of the silicon wafers obtained in Examples 1 to 8 showed excellent results of over 70%. Therefore, the silicon crystal obtained in any of these Examples can be said to be applicable to any device including a device such as DRAM. In the case where the pulling speed was 0.56 to 0.62, and the minimal V/G value was equal to or more than 0.7 and the maximal V/G value was equal to or less than 1.1, still more excellent results were obtained. The high C-mode pass rate was of over 90% in both cases.

It was found that, as compared with Example 8, the other Examples 1 to 7 showed significantly more stable crystal pulling speed. Such a result is considered to show that conditions of the pulling speed and temperature gradient set in Examples 1 to 7 are extremely suitable for stability of the crystal pulling speed.

On the other hand, in each of the Comparative Examples, the high C-mode pass rate was below 70%, or crystal pulling itself was impossible. Therefore, the silicon crystal obtained in any of these Comparative Examples can be said not to be applicable to any device including a low grade device. Reasons for obtaining such poor results in each of Comparative Examples are discussed as follows: Comparative Example 1 was not able to eliminate certain kinds of micro defects present in the OSF region, because the whole surface of the wafer was the OSF region; in Comparative Example 2, the area ratio of the V2 region to the total area of the silicon wafer was less than 80%; in Comparative Example 3 bubble-like shaped aggregates of voids were not formed, because the hydrogen partial pressure was extremely insufficient, and the area ratio of the V2 region to the total area of the silicon wafer was less than 80%; in Comparative Example 4, the V2 region was narrowed because the partial pressure of hydrogen was significantly high; in comparative Example 5, the V2 region was narrowed because the carbon concentration was significantly low; in Comparative Example 6, the "cooling" treatment according to the present invention was insufficient; and in Comparative Example 7 the nitrogen concentration was high, such that a certain kind of the micro defects which may present in the OSF region could not be eliminated, because the whole surface of the wafer was the OSF region.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a silicon single crystal wafer comprising a plurality of voids, wherein 50% or more of the total number of voids are bubble-like shaped aggregates of voids;

a V1 region having a void density of over $2\times10^4$/cm$^3$ and below $1\times10^5$/cm$^3$ which occupies less than or equal to 20% of the total area of the silicon wafer;

a V2 region having a void density of $5\times10^2$ to $2\times10^4$/cm$^3$ which occupies 80% or more of the total area of the silicon wafer; and a bulk micro defect density which is $5\times10^8$/cm$^3$ or more, and wherein the silicon single crystal wafer is doped with nitrogen, hydrogen and carbon;

the method comprising:

pulling a silicon single crystal in a pulling furnace with a crystal pulling speed and doping the silicon single crystal with nitrogen, carbon and hydrogen;

controlling the nitrogen concentration in the silicon crystal to $3\times10^{13}$ to $3\times10^{15}$ atoms/cm$^2$;

controlling carbon concentration in the silicon crystal to $1\times10^{15}$ to $9\times10^{15}$ atoms/cm$^3$;

controlling a partial pressure of hydrogen in the crystal pulling furnace to 3 to 60 Pa;

controlling a temperature gradient in a longitudinal direction of the silicon single crystal within a temperature range of 1100 to 1200° C. to 3.5° C./mm or more;

controlling the crystal pulling speed to less than or equal to an upper limit value and greater than or equal to a lower limit value; and cutting a silicon wafer from the silicon single crystal, wherein the silicon wafer comprises a V1 region having a void density of over $2\times10^4/cm^3$ and below $1\times10^5/cm^3$ which occupies 20% of the total area of said silicon wafer if the single crystal was pulled with the upper limit value of the crystal pulling speed, and comprises a V2 region having a void density of $5\times10^2$ to $2\times10^4/cm^3$ which occupies 80% of the total area of said silicon wafer if the single crystal was pulled with the lower limit value of the crystal pulling speed.

2. The method of claim 1, wherein the oxygen concentration in the silicon single crystal is less than or equal to $7\times10^{17}$ atoms/cm$^3$.

3. A silicon single crystal wafer comprising
a plurality of voids, wherein 50% or more of the total number of voids are bubble-like shaped aggregates of voids;
a V1 region having a void density of over $2\times10^4/cm^3$ and below $1\times10^5/cm^3$ which occupies less than or equal to 20% of the total area of the silicon wafer;
a V2 region having a void density of $5\times10^2$ to $2\times10^4/cm^3$ which occupies 80% or more of the total area of the silicon wafer; and
a bulk micro defect density which is $5\times10^8/cm^3$ or more, and wherein the silicon single crystal wafer is doped with nitrogen, hydrogen and carbon.

* * * * *